US008988923B2

(12) United States Patent
Khalili Amiri et al.

(10) Patent No.: US 8,988,923 B2
(45) Date of Patent: Mar. 24, 2015

(54) NONVOLATILE MAGNETO-ELECTRIC RANDOM ACCESS MEMORY CIRCUIT WITH BURST WRITING AND BACK-TO-BACK READS

(71) Applicant: The Regents of the University of California, Oakland, CA (US)

(72) Inventors: Pedram Khalili Amiri, Los Angeles, CA (US); Richard Dorrance, Santa Monica, CA (US); Dejan Markovic, Los Angeles, CA (US); Kang L. Wang, Santa Monica, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/014,764

(22) Filed: Aug. 30, 2013

(65) Prior Publication Data

US 2014/0071732 A1 Mar. 13, 2014

Related U.S. Application Data

(60) Provisional application No. 61/699,722, filed on Sep. 11, 2012.

(51) Int. Cl.
*G11C 11/22* (2006.01)
*G11C 11/16* (2006.01)

(52) U.S. Cl.
CPC .......... *G11C 11/161* (2013.01); *G11C 11/1673* (2013.01); *G11C 11/1675* (2013.01)
USPC ........... 365/145; 365/157; 365/158; 365/171; 365/173

(58) Field of Classification Search
CPC ...................................... G11C 11/16
USPC .................. 365/145, 157, 158, 171, 173
See application file for complete search history.

(56) References Cited

U.S. PATENT DOCUMENTS

| 2008/0164547 | A1* | 7/2008 | Higo et al. ............... 257/421 |
| 2010/0328993 | A1* | 12/2010 | Ohmori et al. ............ 365/158 |
| 2011/0164448 | A1* | 7/2011 | Sato et al. ............... 365/158 |
| 2011/0260224 | A1* | 10/2011 | Hidaka ................... 257/295 |
| 2012/0012955 | A1* | 1/2012 | Ito et al. ................. 257/421 |
| 2012/0044754 | A1* | 2/2012 | DeBrosse et al. .......... 365/171 |
| 2013/0015542 | A1* | 1/2013 | Wang et al. .............. 257/421 |

(Continued)

FOREIGN PATENT DOCUMENTS

WO 2012/159078 A2 11/2012

OTHER PUBLICATIONS

Ikeda et al. "A perpendicular-anisotropy CoFeB-MgO magnetic tunnel junction", Nature Materials, vol. 9, pp. 721-724, 2010.*

(Continued)

*Primary Examiner* — Fernando Hidalgo
(74) *Attorney, Agent, or Firm* — John P. O'Banion

(57) ABSTRACT

Voltage controlled magneto-electric tunnel junctions (MEJ) and associated memory devices are described which provide efficient high speed switching of non-volatile magnetic random access memory (MeRAM) devices at high cell densities with multiple word access mechanisms, including a burst mode write of multiple words, and a back-to-back read of two words in consecutive clock cycles. In at least one preferred embodiment, these accesses are performed in a manner that prevents any possibility of a read disturbance arising.

20 Claims, 12 Drawing Sheets

(56) References Cited

U.S. PATENT DOCUMENTS

2013/0334632 A1* 12/2013 Park .......................... 257/421
2014/0037990 A1* 2/2014 Abraham et al. ............ 428/826

OTHER PUBLICATIONS

Kryder et al. "After Hard Drives—What Comes Next?", IEEE Transactions on Magnetics, vol. 45, pp. 3406-3413, 2009.*

J. G. Alzate, P. Khalili Amiri, et al., "Voltage-Induced Switching of Nanoscale Magnetic Tunnel Junctions," in 56th Conference on Magnetism and Magnetic Materials Scottsdale, Arizona, 2011, pp. EG-11.

W.G. Wang, et al., "Electric-field-assisted switching in magnetic tunnel junctions," Nat Mater, vol. 11, pp. 64-68, 2012.

Y. Shiota, et al., "Induction of coherent magnetization switching in a few atomic layers of FeCo using voltage pulses," Nat Mater, vol. 11, pp. 39-43, 2012.

J. Barth, et al., "A 500 MHz Random Cycle, 1.5 ns Latency, SOI Embedded DRAM Macro Featuring a Three-Transistor Micro Sense Amplifier," IEEE Journal of Solid-State Circuits, vol. 43, No. 1, pp. 86-95, Jan. 2008.

M. Khellah, et al., "A 256-Kb Dual-VCC SRAM Building Block in 65-nm CMOS Process with Actively Clamped Sleep Transistor," IEEE Journal of Solid-State Circuits, vol. 42, No. 1, pp. 233-242, Jan. 2007.

C. Villa, et al., "A 65nm 1Gb 2b/Cell NOR Flash with 2.25MB/s Program Throughput and 400MB/s DDR interface," 2007 IEEE International Solid-State Circuits Conference Digest of Technical Papers {ISSCC}, pp. 476-616, Feb. 2007.

K. Tsuchida, et al., "A 64Mb MRAM with clamped-reference and adequate-reference schemes," 2010 IEEE International Solid-State Circuits Conference Digest of Technical Papers (ISSCC), pp. 258-259, Feb. 2010.

Dorrance et al. "Diode-MTJ Crossbar Memory Cell Using Voltage-Induced Unipolar Switching for High-Density MRAM" IEEE Electron Device Letters, vol. 34, No. 6, Jun. 2013.

* cited by examiner

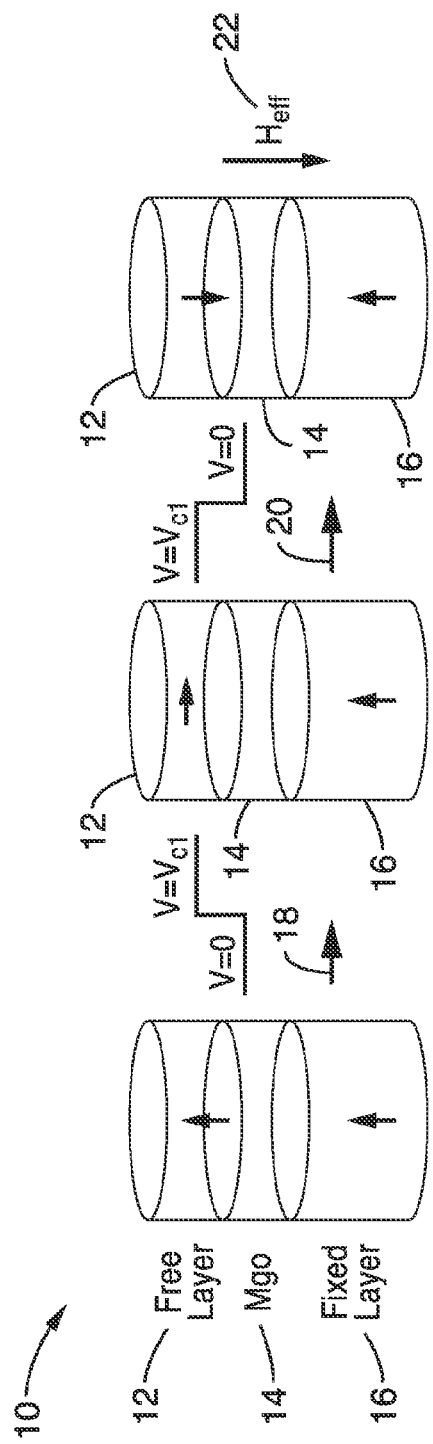
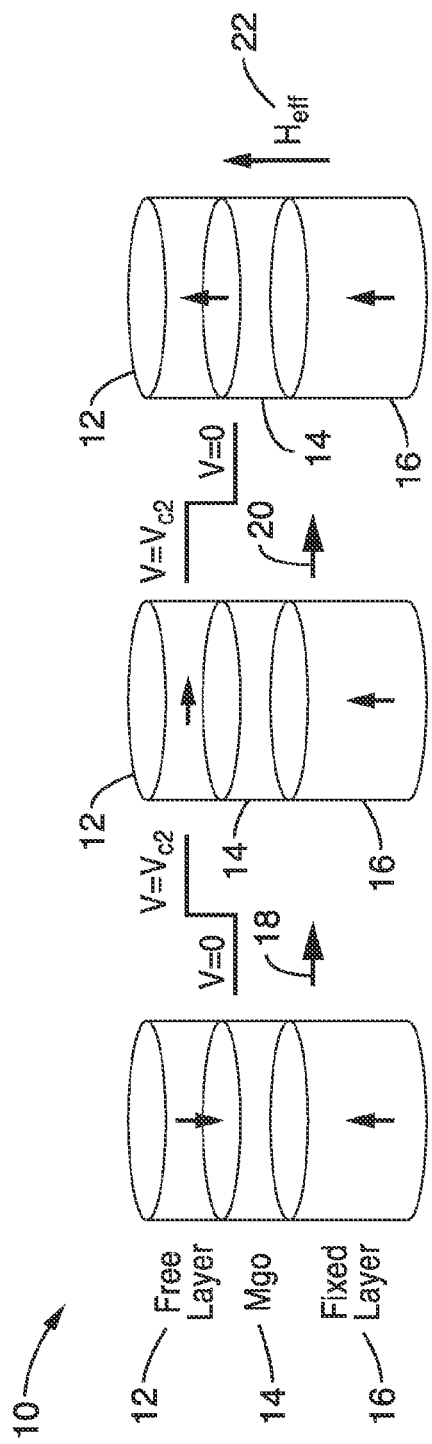
FIG. 1A
FIG. 1B

NONVOLATILE MAGNETO-ELECTRIC RANDOM ACCESS MEMORY CIRCUIT WITH BURST WRITING AND BACK-TO-BACK READS

CROSS-REFERENCE TO RELATED APPLICATIONS

This application is a nonprovisional of U.S. provisional patent application Ser. No. 61/699,722 filed on Sep. 11, 2012, incorporated herein by reference in its entirety.

STATEMENT REGARDING FEDERALLY SPONSORED RESEARCH OR DEVELOPMENT

This invention was made with Government support under HR0011-10-C-0153, awarded by the Department of Defense, Defense Advanced Research Projects Agency. The Government has certain rights in the invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to magnetic random access memory (MRAM), and more particularly to voltage controlled MeRAM using magneto-electric tunnel junctions (MEJs) for providing burst writing and back-to-back reads.

2. Description of Related Art

The electronics industry continually seeks higher density memory devices that operate with lower power consumption since electronic devices increasingly include significant amounts of solid state memory.

Dynamic random access memories (DRAM) are dense, but volatile in that they do not retain data for any significant amount of time without refreshing (a form of rewriting). DRAMs also consume large amounts of power. Static RAM (SRAM) memories are fast, yet they are large and consume significant power. FLASH memories are a form of electronically erasable programmable read only memory (EEPROM), and while being very dense and nonvolatile, provide very slow accesses and have a high power consumption.

One class of memory devices drawing increasing attention as a next generation memory type are magnetic memory devices (MRAM) which are inherently non-volatile.

Magnetic random access memory (MRAM) has generally been implemented with a magnetic-field-controlled or electric-current-controlled write mechanism. Data within an MRAM is not stored as electric charge or current flows, as in a conventional RAM, but instead by magnetic storage elements formed from ferromagnetic plates, separated by insulating material. In a magnetoresistive RAM, reading is performed in response to measuring the electrical resistance of the cell, which changes due to the orientation of the fields in the two plates. Data writes are performed by inducing a magnetic field in response to current through write lines to change magnetic orientation.

One form of magnetic memories are spin transfer torque RAM (STT-RAM) memories. Spin transfer torque (STT) techniques use spin-aligned ("polarized") electrons to directly torque the domains. In particular, if the electrons flowing into a layer are forced to change their spin, this will develop a torque that will be transferred to the nearby layer. Using STT, power requirements are substantially lowered. There has been a significant amount of research and development on STT-RAM, where electric currents are driven through a magnetic tunnel junction (MTJ) bit to switch it and thus to write information into it. The use of currents for writing STT-RAM, however, still involve substantial energy dissipation, and allow only a limited memory array density since each magnetic bit requires a large access transistor to drive its large write current, which also limits its scalability. Furthermore, STT-RAM memories also suffer from possible disturbance of the stored information during read operation.

A prior patent application of the Applicant describes a voltage-controlled (i.e., electric-field-controlled) magneto-electric random access memory (MeRAM), where information is written into the bit using pulsed voltages, rather than currents. MeRAM is nonvolatile, very dense, fast, and extremely low power. Other memory technologies (DRAM, SRAM, FLASH, STT-RAM) have a performance-reliability trade-off associated with bit readout, which is eliminated using MeRAM. MeRAM also offers a superior scaling behavior for energy and density, compared to STT-RAM, due to the fact that it uses voltages, rather than currents, to write information into the memory bits. MeRAM can provide high density memories with low power, yet it would be beneficial to increase the speed of read and write operations on these devices while eliminating the possibility of data being disturbed during read operations.

Accordingly, a need exists for energy efficient, high density magnetic memory devices that provide fast access and that are not subject to read disturbance. The present invention fulfills these needs and others while overcoming many shortcomings of previous magnetic memory devices.

BRIEF SUMMARY OF THE INVENTION

An MeRAM is described using voltage-controlled magneto-electric tunnel junctions MEJs and a voltage-controlled magnetic anisotropy switching mechanism. The MeRAM provides significantly better scalability, energy efficiency, and density as compared to STT-RAM, as well as existing high-performance embedded memory technologies such as eDRAM and SRAM.

In the present invention, MeRAM is configured with reading and writing mechanisms that are completely decoupled, guaranteeing read-disturbance-free operation. To write data to the bit-cell, a first polarity voltage is applied between the bit line (BL) and source line (SL), with the word line (WL) selected. To read data from the bit-cell, a second, opposite, polarity voltage is applied between the BL and SL, with the WL selected. When the WL is unselected, the cell can be neither written to nor read from.

In addition, the overall speed of reading and writing is increased in response to a method of performing burst writing and back-to-back read operations. In particular, the memory cell is arranged and control signals generated to provide for a multiword burst write operation in which a number of words are written in a burst writing scheme that increases throughput between 70% and 370%. Back-to-back reads are also described in which two bits are read "back-to-back" on sequential clock cycles which is made possible by the structure of the inventive MEJ cell.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 1A and FIG. 1B are schematics of voltage-induced switching of a voltage-controlled MEJ from P to AP and from AP to P.

DETAILED DESCRIPTION OF THE INVENTION

Figure 2:
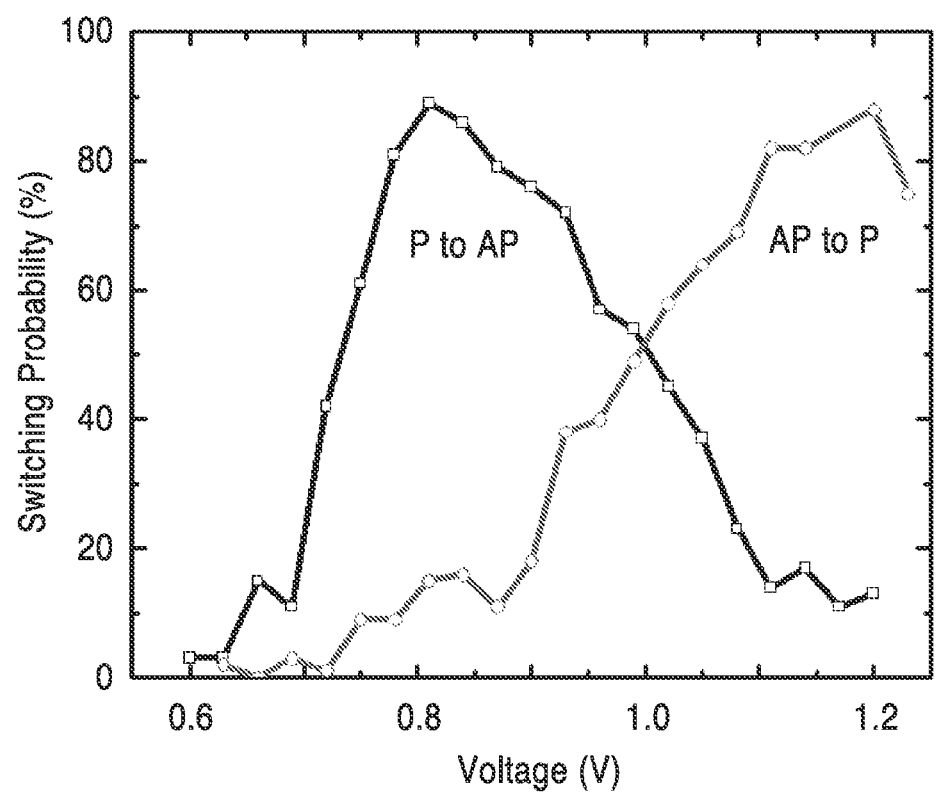
FIG. 2 is a graph of switching probability in response to pulse voltages for an MEJ using voltage controlled magnetic anisotropy (VCMA), according to an element of the present invention.

1. Multiple Word Accesses for Voltage Controlled MeRAM.

1.1. Introduction of MeRAM Operation.

The MeRAM of the invention utilizes voltage controlled magneto-electric tunnel junctions (MEJs) to provide efficient multiple accesses in the form of multiple word burst writing and back-to-back reads which can be configured to prevent any possibility of read disturbance. Thus, fast memory accesses are provided while variations in absolute voltage level or pulse length during reads, does not incur a probability of error by switching the state of any data bits.

The VCMA MEJ switches within the MeRAM device perform switching without relying on the flow of large electric charge currents either through the device or through a conductor placed close to the device, as they rely on the VCMA effect for switching. Information is stored in the state of a magnetic bit (i.e., in a free layer, FL). The magnetization of the FL can be switched from one state to another using an applied voltage, such as either solely in response to the applied electric field, or to assist in or be utilized in conjunction with, a magnetic field or current-induced switching process.

The voltage controlled MEJ comprises a combination of at least two ferromagnetic layers (FM) separated by a dielectric layer which reduces current passage. The DE layer is not sufficiently conductive to allow changing the state of the VCMA switch, or writing the state of an MeRAM bit, based on current flow.

The two FM layers comprise at least an FM fixed layer and an FM free layer. Material, shape and thickness of the FM free layer is selected to have in-plane (IP) and out-of-plane (OOP) anisotropies. The OOP anisotropy of said FM free layer is affected by interface properties between the FM layers and the DE layer, and is controlled by voltages applied across the DE layer as an applied voltage, giving rise to a voltage-controlled magnetic anisotropy (VCMA) effect which switches magnetization orientation of the FM free layer in the apparatus. Magnetization of the free layer is switchable between two magnetization orientation states that are either in-plane (IP) or out-of-plane (OOP). These magnetization orientation states are parallel (P) and anti-parallel (AP) with respect to magnetization orientation of said FM fixed layer. Data is written and retained in the MEJs of a memory array by changing the magnetization states (AP or P) of the MEJs in response to voltage application. A significant flow of current is not required to perform the switching, although a small bias/leakage current (e.g., <10 µA) will be present.

The fixed layer may or may not be configured for exchange using an anti-ferromagnetic film (e.g., Platinum-Manganese (PtMn) or Iridium-Manganese (IrMn)). It may also be replaced in some embodiments by a synthetic anti-ferromagnet (SAF) material.

It should be appreciated that additional layers may be present without departing from the present invention. For example, the fixed layer may be augmented by adding one or more ferromagnetic semi-fixed layers separated by dielectric layers. In addition, the free layer and fixed layers may each comprise a combination of ferromagnetic and non-magnetic layers, and may be capped or seeded by other non-magnetic layers.

Voltage-Controlled MEJs are switched using voltage-controlled magnetic anisotropy (VCMA) by putting their free layer into a meta-stable intermediate state using an applied voltage pulse. When the voltage is removed, the free layer relaxes to either the parallel (P) or anti-parallel (AP) state depending upon the overall magnetic field acting on the free layer.

FIG. 1A and FIG. 1B illustrate an embodiment 10 of MEJ switching performed from P to AP in FIG. 1A and for AP to P in FIG. 1B for out-of-plane magnetization (vertical). Each of the figures depicts transition from an initial state, to an intermediate state to a final state. Similar figures could be shown for in-plane-magnetization (horizontal), as it operates in the same manner. In each of FIGS. 1A and 1B, magnetization is forced from a stable state (shown at the left of the figure) into a meta-stable state (shown in figure center) by an applied pulse voltage. Upon relaxing the applied voltage, magnetization relaxes (shown at the right) to a (similar or different) stable state. In some cases the initial equilibrium state and the end state may include both an out-of-plane component and an in-plane component (not shown) due to the compensation between in-plane shape anisotropy and out-of-plane interfacial anisotropy.

More particularly, each of the figures depict a free layer 12, in relation to a dielectric layer 14 (e.g., MgO) and a fixed layer 16. The free layer 12 and fixed layer 16 are ferromagnetic (FM) materials, such as comprising Fe, Co, CoFe, or CoFeB. A dielectric (DE) tunnel barrier 14 comprises dielectric material, such as comprising MgO, interposed between said FM free layer and FM fixed layer.

It should be noted that typically a higher Fe content in the CoFeB ferromagnet leads to larger perpendicular anisotropy. Thus, the present invention allows selecting the level of perpendicular anisotropy by adjusting composition, shape and thickness of the ferromagnet.

In addition, the device can optionally incorporate one or more semi-fixed layers, describing a layer in which magnetization can be rotated for some applied voltages, but not for others. Incorporating a semi-fixed layer, the device operates in a set/reset mode, in which a first voltage is applied to change the magnetization state from reset to set, but subsequent application will not change the device state. The application of a larger voltage is used to return the device state to the reset condition. Still further, the fixed and semi-fixed layers may or may not be exchange-coupled through a metallic barrier film (e.g., Ruthenium (Ru)). They can also be separated by an ordinary metal (e.g., Tantalum (Ta)) or dielectric material and thus only be dipole-coupled.

It should be appreciated that each of the free and fixed layers may themselves comprise several sub-layers, that acting in combination provide the free or fixed layer functionality. An example is a synthetic antiferromagnetically coupled free or fixed layer, such as two CoFe or CoFeB films which are exchange-coupled through a thin metallic barrier such as Ruthenium (Ru). These additional layers, for example, can be seen in FIG. 8. One of ordinary skill in the art will recognize that many such combinations can be configured to provide a fixed layer and a free layer. The free layer composition and capping (or seed) layers can be selected, such as to induce a large perpendicular magnetic anisotropy in it. Examples of capping or seed layer materials include Tantalum (Ta), Ruthenium (Ru), Hafnium (Hf), Vanadium (V), and Palladium (Pd), and composition examples include Fe-rich films such as $Co_{40}Fe_{40}B_{20}$ or $Co_{20}Fe_{60}B_{20}$. It should be appreciated that the above are provided by way of example only, and the invention is by no means limited to these materials or compositions as it can be practiced across a range of other materials.

The ferromagnetic free and fixed layers have an in-plane (IP) and an out-of-plane (OOP, also referred to as perpendicular) magnetic anisotropy. The OOP anisotropy is affected by the FM/DE interface properties (as well as, depending on the materials, the cap or seed layer materials), and can be controlled by electric fields (i.e., voltages) applied across the DE layer, thereby giving rise to a voltage-controlled magnetic anisotropy (VCMA) effect. The OOP anisotropy is increased or reduced depending on the characteristics of the applied voltage, and in this case the polarity of the applied voltage (i.e., direction of the electric field). The effect is opposite on the two sides of the DE barrier if both sides have the same FM material, for example if positive voltages increase the OOP anisotropy on one side they reduce it on the other side. The OOP anisotropy can additionally be tuned by controlling the FM composition (e.g., providing higher OOP anisotropy for higher Fe content in CoFeB), and the FM thickness (e.g., OOP anisotropy is larger for thinner films), as well as capping or seed layers (e.g. Ta provides larger OOP anisotropy compared to Ru when placed next to a CoFeB film adjacent to MgO).

In the following descriptions, it should be appreciated that IP and OOP anisotropies represent tendencies of the magnetization to go into the IP or OOP state. Since both anisotropies are present in devices according to the invention, the actual state of the magnetization may differ from the IP and OOP configurations. Accordingly, it is important not to confuse axes of anisotropy and directions of magnetization, which may or may not be the same.

Referring to FIGS. 1A and 1B, a pulse voltage ($V_{C1}$ in FIG. 1A and $V_{C2}$ in FIG. 1B) is applied 18 to the MEJ shown at the left which forces magnetization into a meta-stable state seen in the center state. The meta-stable state then relaxes to a (similar or different) stable state after the removal 20 of the applied voltage. The final state 22, seen in the rightmost depiction depends on the direction of the overall magnetic field acting on the free layer, and can be controlled by applying a small external field.

Application of the electric field (i.e., voltage), across the DE layer enhances perpendicular anisotropy on one side of the DE and reduces it on the other. The applied voltage generates no magnetization change on the fixed layer side, while rotating the magnetization of the free layer, allowing it to be switched by the stray field from the fixed layer. The difference between the terms "rotation" and "switching" should be appreciated. The term rotation, is meant herein to preferably refer to a 90 degree rotational change, although it can be somewhat less, but is usually more than a 45 degree rotational change from the stable state (i.e., from in-plane toward out-of-plane or from out-of-plane toward in-plane). The term "switching," on the other hand, refers to a full 180 degree reorientation of the magnetization. Hence, when rotation by the applied voltage is referred to, this only constitutes part of the full switching, which allows the stray field to then take it the remainder of the way to the full 180 degree switch (i.e., 180°=90° (V)+90° (stray field) or 85° (V)+95° (stray field), and so forth).

It should be appreciated that the role of the external field can be replaced by current-induced torques by allowing for a small leakage current to pass through the device, or by addition of a semi-fixed layer to the material stack, or by timing of the voltage pulse, as outlined above.

Accordingly, the final state depends on the direction of the overall magnetic field acting on the free layer, which in turn can be determined by the voltage pulse amplitude. It should be appreciated that an MEJ can be implemented which switches in response to positive voltage as seen, or using a slightly different design having an opposite sensitivity to electric fields it will switch in response to negative voltage.

In addition, in certain cases the original pulse is timed to result in a precessional motion of the free layer magnetization, instead of an intermediate out-of-plane or micromagnetic domain state, then the final state is determined by the pulse width utilized, rather than by stray fields. In this case, pulses timed at approximately ½ of the precessional period, or at an odd multiple thereof, will switch the bit to the opposite state (P to AP, or AP to P), while pulses timed at one or multiple full precessional periods will not switch it. It should be noted that the pulse widths can deviate up to about 20% from the ½ precessional period, or multiple thereof, and still be effective. In the absence of external magnetic fields, internal magnetic fields (such as due to leakage current), or very short voltage pulses (less than about 1-5 ns), each of these switches performs voltage-controlled switching only in one direction. Switching in the opposite direction can be performed by other means, such as a magnetic field or spin polarized current.

FIG. 2 depicts measured switching probability (based on 100 attempts with 100 ms long pulses) as a function of pulse voltage, for a 60 nm×190 nm high-resistance MEJ with an RA product of approximately 170Ω–μm$^2$. Switching in both directions is performed with the same voltage polarity.

The small, non-zero leakage current through the device, while not sufficient to bring about STT-induced switching by itself (due to the thick MgO), contributes to a spin transfer torque, which acts as a voltage-dependent effective magnetic field on the free layer. This allows for a unipolar set/reset write method to be utilized, where voltage pulses of the same polarity, yet with different amplitudes, pulse widths, or a combination of different amplitude and pulse widths, can be used to switch the device in opposite directions. Voltage pulses of the opposite polarity will not switch the device.

Magneto-Electric Tunnel Junctions (MEJs) with a voltage-controlled switching mechanism as seen above are utilized to construct a nonvolatile random access memory (RAM). Voltage controlled MeRAM memories can be utilized in a wide range of applications, including embedded or stand-alone applications in various electronics, including the memory caches on a microprocessor or microcontroller, computer memory, disk storage, data centers, and so forth.

1.2. Performing Non-Disturbance Reads.

In the present invention, a mechanism is utilized to prevent reads from affecting data already written. This mechanism can be utilized within any voltage controlled MEJ to increase its reliability. It has already been seen that MeRAM operation allows performing writes at two different voltage profiles (combination of voltage level and pulse widths) of a single polarity. To prevent reads from disrupting data, reads are performed at the opposite polarity as the write operations. In this way, the read voltage levels cannot fall into the A to AP, or AP to A switching regimes leading to corruption of the stored data.

In particular, embodiments of the present invention are preferably configured for writing information into the memory using different voltages of a first polarity, while reading is performed utilizing different voltages of a second, opposite polarity. In this way, the possibility of read disturbances are eliminated. For example, during reading, only negative voltages are applied between the fixed and free layers of the MEJs, while positive voltages are applied during write operations. This form of different polarity accesses are made possible by the nature of the MEJ in response to using voltage-controlled magnetic anisotropy (VCMA) for switching of the data states. Switching is performed between P to AP magnetic states and AP to P magnetic states, using voltages of the same polarity to determine the direction.

As was seen in FIG. 2 the difference in voltage for switching between these two states of a given polarity was shown. However, since reading of the MeRAM device is performed in response to measuring resistance across the MEJ; reading can be performed using an opposing polarity, whereby the reading voltage does not overlap the P to AP or AP to P switching regimes depicted in FIG. 2 associated with data writing.

1.3. MeRAM Memory Array Layout.

Figure 3:
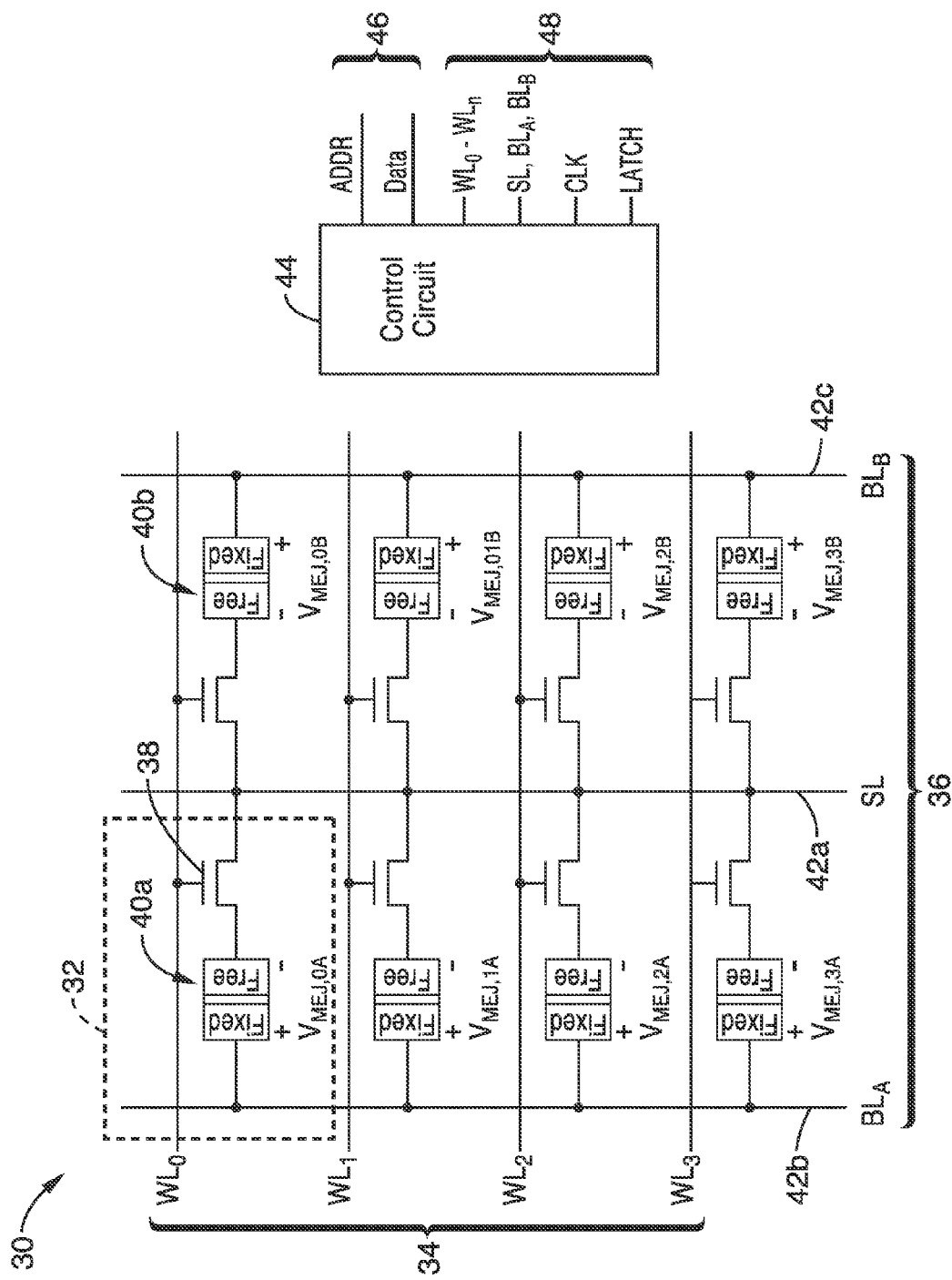
FIG. 3 is a schematic of an array of MeRAM using voltage controlled MEJs according to an element of the present invention.

FIG. 3 illustrates an example embodiment 30 of an array of MeRAM cells 32 using voltage-controlled MEJs arranged symmetrically about the source line. Data is stored in a one-transistor to one MEJ (1T-1MEJ) manner in each cell. A plurality of word lines 34 are seen exemplified as four word lines WL0-WL3 coupled to array 30. Similarly, a group of bit lines 36 are shown with a source line 42a, and an A bit line, BL$_A$, 42b on a first side, and a B bit line, BL$_B$, 42c on an opposing side. Each cell 32, contains a single voltage-controlled magneto-electric tunnel junction MEJ 40a or 40b, depicted with a free FM layer and a fixed FM layer (other preferably included layers are not shown for the sake of simplicity). It will be noted that the MEJs 40a, 40b on opposite sides of source line 42a are oriented in opposing directions with respect to the shared source line. The voltages applied to each of the MEJs are depicted as being V$_{MEJ,0A}$, V$_{MEJ,0B}$, V$_{MEJ,1A}$, V$_{MEJ,1B}$, V$_{MEJ,2A}$, V$_{MEJ,2B}$, V$_{MEJ,3A}$, and V$_{MEJ,3B}$, which are similarly oriented in relation to the source line. A transistor 38 is shown in each cell 32 for accessing the MEJ. The transistor is seen gated by the word line and having its source and drain connections coupled to said MEJ and to the source line (SL) associated with a first and second bit line (BL$_A$ and BL$_B$), within each said MeRAM memory cell of said array.

A control circuit 44 is shown in the figure which generates the signals to the MeRAM array, which by way of example and not limitation, comprise address (Addr) and data (Data) signal 46, as well as control signals 48 including multiple word lines (WL$_0$-WL$_n$), source line (SL), bit lines (BL$_A$ and BL$_B$), a clock signal (Clk), and a latch signal (Latch) as already described. It will be appreciated that the ability to use digital circuitry to generate address, data and control signals (e.g., BL$_A$, BL$_B$, SL, WL, Clk and Latch) of various timings and signal amplitudes for a memory array is well known and recognized, whereby there is no need in the present invention to include further details on these circuits.

Figure 4:
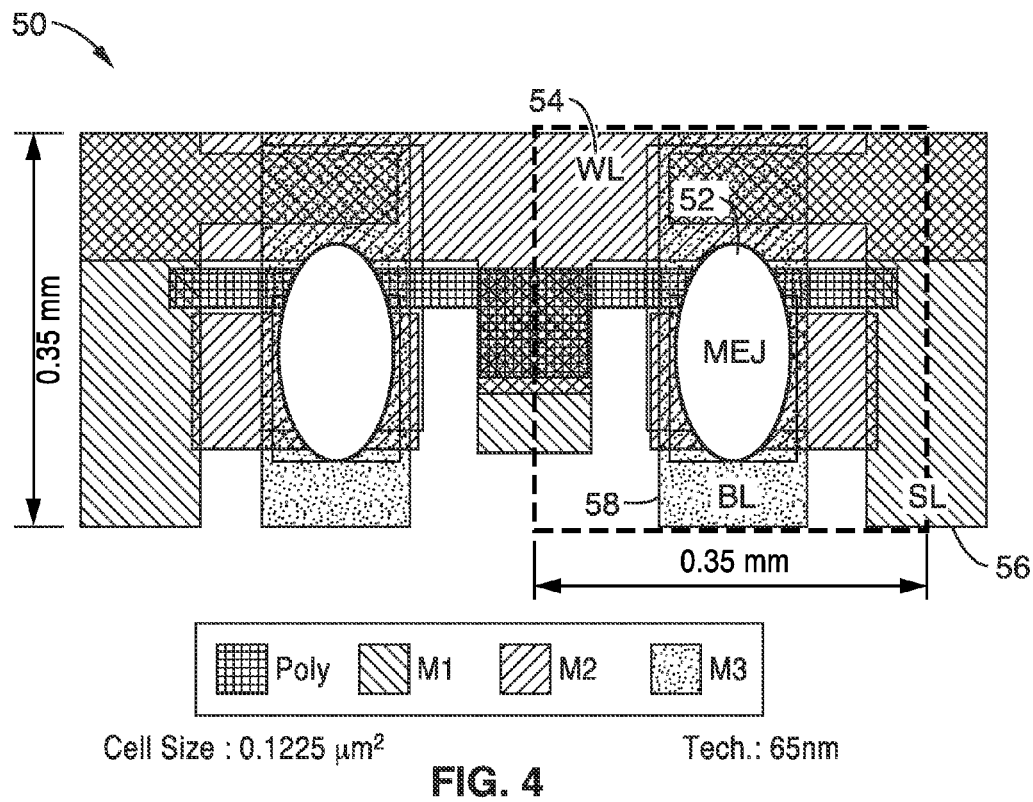
FIG. 4 is a layout diagram of MEJs within a portion of an array of MeRAM according to an embodiment of the present invention.

FIG. 4 illustrates a layout 50 of the MeRAM cell shown in FIG. 3, depicting the MEJ 52, write line 54, source line 56 and bit line 58, along with four different materials, poly, M1, M2, and M3 shown by different shading. By sharing source-lines between adjacent MeRAM cells, a 0.1225 μm$^2$ (15F2) cell size per bit can be achieved in a 65 nm CMOS technology.

Figure 5:
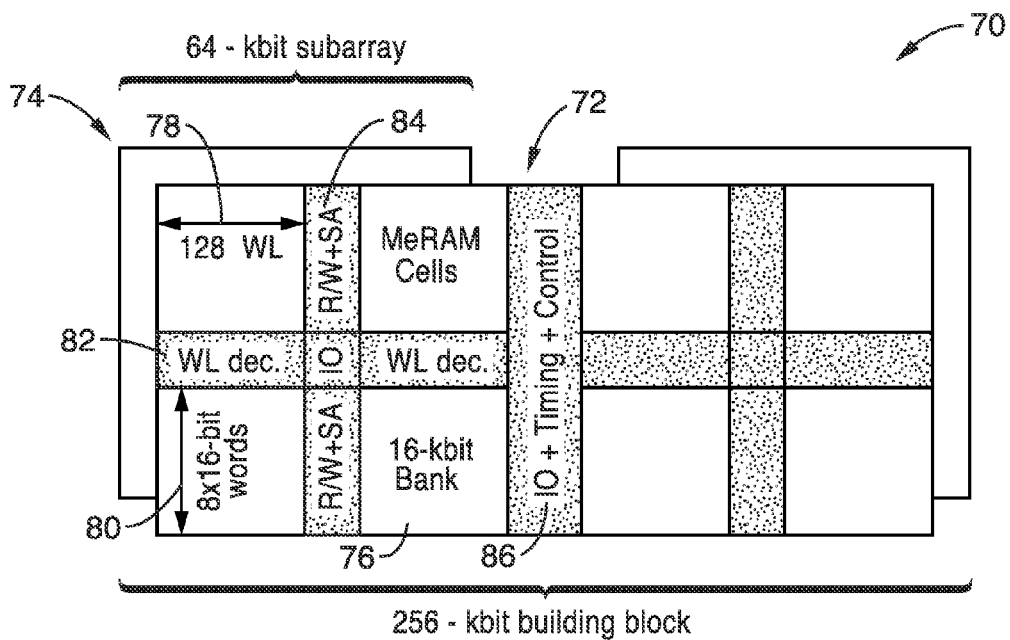
FIG. 5 is a layout diagram of a 256 kbit MeRAM building block with subarrays according to an embodiment of the present invention.

FIG. 5 illustrates a general layout 70 of a 256 kbit building block 72 with 64 kbit subarray 74. Each subarray is partitioned into four 16 kbit banks 76, with each bank having 128 word lines 78, with eight 16 bit words 80 per word line. In the figure one sees a word line path 82 in a first orientation (e.g., horizontal) as well as a R/W and sense path 84, along with I/O-timing-control lines 86 in a second orientation (e.g., vertical).

One of ordinary skill in the art will appreciate that the structure of FIG. 5 is necessary for the concurrent burst writing of multiple words and back-to-back reading operation. This is true, because as seen in FIG. 5, each WL is organized to contain several words, for example: 8 16-bit words for a total of 128 bits per word line as seen in the figure. The bits for each word are interleaved, such as word0, word1, word2, word3, word4, word5, word6, word7, word0, word1, word2, word3, word4, word5, word6, word7, and so forth. Each bit cell on the WL also requires a SL and a BL to operate as described. By sharing the SL between the bits in word0 and word1 (as shown in FIG. 3), we can simultaneously write all of the bits in words 0 and 1 if we modulate the BLs properly on each cell. This is only possible if the SL is shared and the proper signals are applied to the BLs. The present invention supports more simultaneous words being written by sharing more bits per SL (i.e., 4 words with a single SL, but BLs A, B, C, and D).

One of ordinary skill in the art will appreciate that a similar situation arises for the described back-to-back read operations which are achieved for multiple bits (2+) that are shared on the SL by grounding the desired bit and leaving the other bits floating. For 2 bits, there would be 1 cycle of latency. For 3 bits, 2 cycles of latency; and so on. By reading multiple words from the same WL, the sizable delay associated with selecting the WL can be ignored, allowing more time for reading at each clock cycle. Said another way, the circuit does not require each clock cycle to be as long anymore, resulting in a beneficial speed increase for these back-to-back reads, over single reads, between approximately 5-20%.

1.4. MeRAM Multiple Read and Write Operations.

In view of the unique nature of voltage controlled MeRAM, memory arrays can be configured and utilize access signaling which provides forms of multiple word access to speed operation.

Due to the shared source-lines depicted in FIG. 3 and FIG. 4, about which the MEJ cells are symmetrically disposed, multiple MeRAM cells can be written simultaneously during a write operation. To perform writing multiple bits in a single write cycle, the source line (SL) is pulled low and the word line (WL) corresponding to the desired row of MeRAM cells is pulled high. Memory cells $MEJ_1$ and $MEJ_2$ which are symmetrical about SL as seen in FIG. 3, are then written by applying the appropriate switching voltages to $BL_A$ and $BL_B$, respectively.

Figure 6:
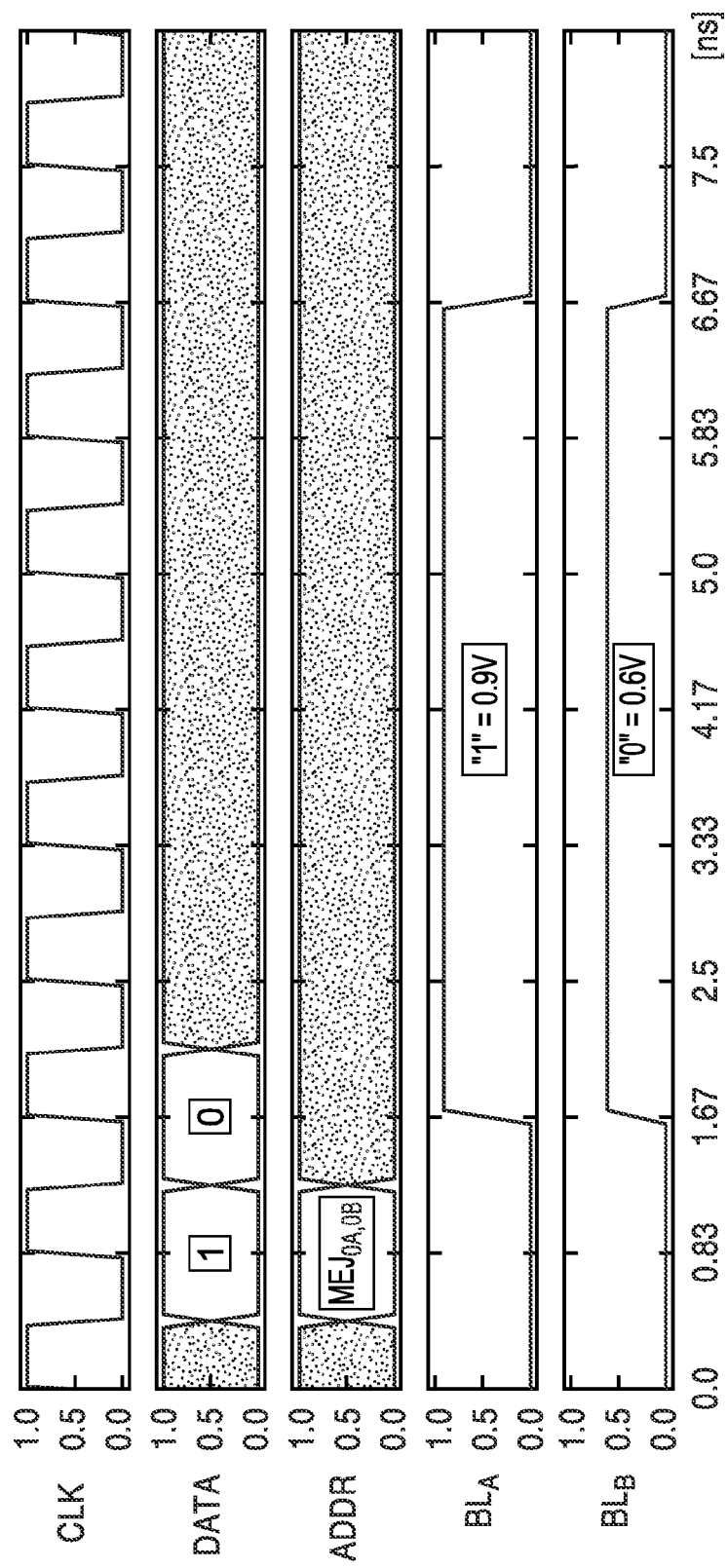
FIG. 6 is a timing diagram of a multiple word burst writing scheme according to an element of the present invention.

FIG. 6 is a timing diagram exemplifying an embodiment of multiple word burst writing, respectively, according to the present invention. The figure depicts the clocking (CLK), data lines (DATA), address lines (ADDR), and bit line states ($BL_A$ and $BL_B$). It can be seen in the diagram that a common address $MEJ_{0A}$ and $MEJ_{0B}$ is loaded on the address bus ADDR, while a first and second data word (seen as 1 and 0) are alternatively active on two sequential clock cycles. It should be appreciated that words "A" and "B" (the zero bit of each located in $MEJ_{0A}$ and $MEJ_{0B}$) are both located on $WL_0$ (item 80 in FIG. 5). Since the words are on the same WL according to this structure, the same address given to the WL decoder (item 82 in FIG. 5) can activate both words for writing at the same time (item 84 in FIG. 5) in a write circuit embodiment so configured. Bit line $BL_A$ is driven to a first voltage of a first polarity (e.g., 0.9V), and bit line $BL_B$ is driven to a second voltage of the first polarity. It should be appreciated that the different "voltages" to which the bit lines are driven comprise a voltage profile which is a combination considering both pulse amplitude and pulse length. Thus, the actual amplitude of the voltages could be the same with different pulse widths, or the same pulse width could be used with different amplitudes, or a combination with different pulse widths and amplitudes. The data is first buffered in (1 cycle for 2 bits, 2 cycles for 3 bits, and so on), as seen in FIG. 6, with writing occurring (e.g., from 1.67 ns to 6.67 ns as seen in the figure) after data was latched in at 0.83 ns and 1.67 ns. Once the data is latched in, the concurrent write commences for multiple bits. So for 2 words, only 1 cycle is needed to buffer and 6 cycles needed to write (this length actually depends upon the MEJ) for a total of 7 cycles. For 4 words, 3 cycles are required for buffering and 6 cycles for writing to arrive at 9 cycles total. For writing 8 words, 7 cycles are required for buffering and 6 cycles to write for a total of 13 cycles.

Accordingly, for the example shown of 2 word burst writing, the write is completed in 7 cycles, thereby increasing throughput by 70%. It should be appreciated that burst writing, as seen in FIG. 6, can significantly reduce writing overhead by exploiting the ability to simultaneously write several MeRAM cells through the use of the shared source-lines. Writing in 2-, 4-, and 8-word bursts takes only 7, 9, and 13 cycles, respectively, and increases throughput between 70% up to 370%.

Figure 7:
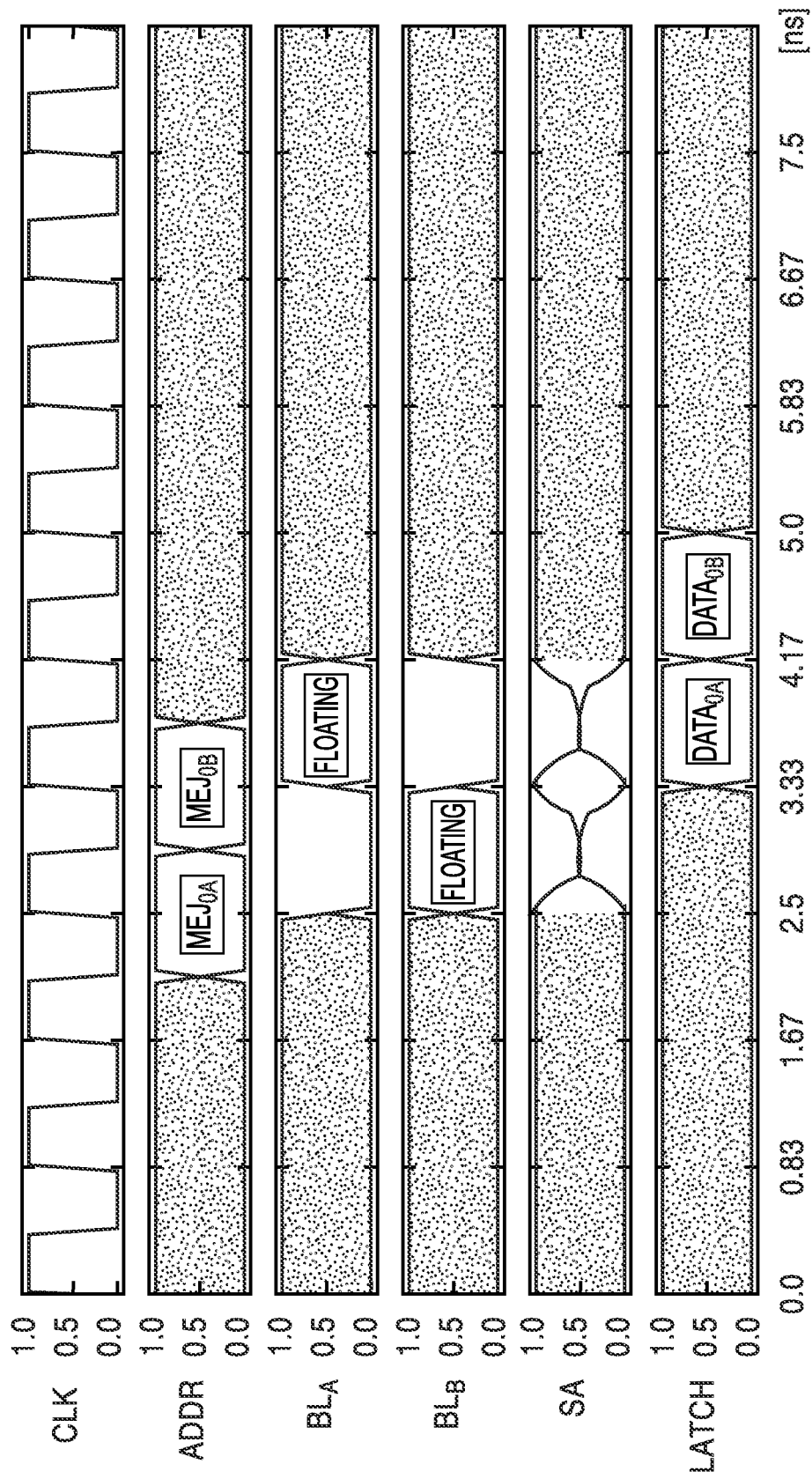
FIG. 7 is a timing diagram for back-to-back, single-cycle latency reads for two bits according to an element of the present invention.

FIG. 7 is a timing diagram exemplifying an embodiment of back-to-back data reading according to the present invention. Unfortunately, multiple MeRAM words cannot be read simultaneously during the read operation. However, the present invention provides for back-to-back data reads. Consider two data words, the figure depicting only one bit of each word $MEJ_{0A}$ and $MEJ_{0B}$. To read $MEJ_{0A}$, $WL_0$ is pulled high, $BL_A$ is grounded, and $BL_B$ is left floating. A sense-amp is then used to measure the resistance of the sense line (SL). Similarly, to read $MEJ_{0B}$, $WL_0$ is pulled high, $BL_B$ is grounded, and $BL_A$ is left floating. Described another way, data can be read from two (or more) words in a back-to-back manner with a first data word read in a first clock cycle by activating a first word line and a first bit line with the other bit line floating, then a second data word is read in a second clock cycle by activating a second word line and a second bit line with the other bit line floating. Using the back-to-back reading allows the circuit to have a clock that is anywhere from 5-20% faster because setup time is no longer a concern for the delay associated with the WL decoder (element 82 in FIG. 5). Since the voltage applied between the fixed and free layers of both MEJs is negative during the entire read operation for both cases, the probability of accidental writing is 0.

The 256-kbit MeRAM building block embodiment described in FIG. 5 has been simulated for fabrication in a 65 nm technology, using voltage-controlled MEJs with an $R_P$ of 100 kΩ, a tunnel magnetoresistance (TMR) of 100%, and set/reset voltages of 0.9V and 0.6V, respectively, for approximately 5 ns device switching. It should be appreciated that the TMR phenomenon exists in MEJs describing different resistance values $R_P$ for resistance value in the parallel orientation, and $R_{AP}$ for anti-parallel resistance.

As previously described, the building blocks seen in FIG. 5 consist of four 64-kbit subarrays, with each subarray partitioned into four 16-kbit banks. Each bank has 128 word-lines, with eight 16-bit words per word-line. In simulation, the MeRAM building block can run up to 1.2 GHz with a 1-cycle latency random access read and a 6-cycle random access write, such as according to the timing diagrams depicted in FIG. 6 and FIG. 7. A short-pulse-reading (SPR) sense-amplifier with body-voltage-based sensing is used to achieve sub-1 ns reading performance.

Table 1 compares the performance, area, and energy efficiency of MeRAM to state-of-the-art eDRAM, SRAM, and STT-RAM high-performance embedded 65 nm memory technologies. Although the invention can be embodied with various technologies at various scaling levels, it may be particularly well suited for integration with a CMOS technology below 90 nm to achieve the highest density and lowest power.

It will be seen from the table that MeRAM achieves both the smallest cell size and the highest energy efficiency by a significant margin. The excellent energy efficiency can be attributed to very low read and write currents, coupled with a very fast sensing time. Only the SRAM is faster than MeRAM. Compared to STT-RAM, MeRAM is 3 times denser, 18 times faster, and 6 times more energy efficient. The following sections provide additional details about general MeRAM structure and operation.

2. General MeRAM Structure and Operation.

Figure 8:
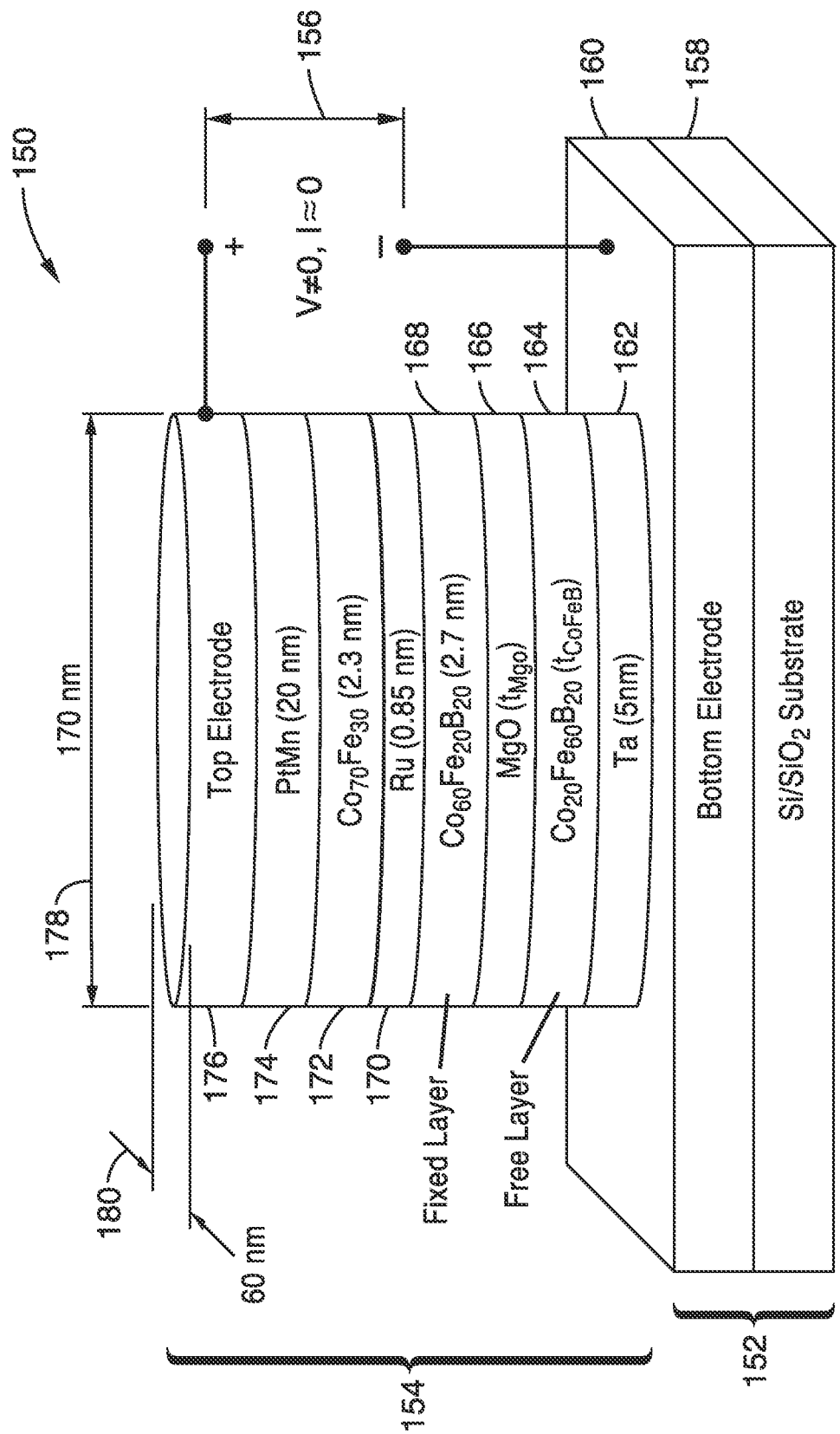
FIG. 8 is a side view of an MEJ having a free and fixed layer according to an element of the present invention.

FIG. 8 illustrates an example embodiment 150 of a magneto-electric tunnel junction (MEJ) configured for voltage switching. A pillar section 154 extends from a planar section 152. A voltage is shown being applied 156 between the top and bottom of pillar 154. By way of example an $Si/SiO_2$ substrate 158 is seen over which is a bottom electrode 160 of a conductive material. The pillar 154 comprises the following layers in order. A tantalum (Ta) layer 162 (e.g., 5 nm) above which is seen a free layer 164 of a ferromagnetic material (e.g., iron), such as one also containing Cobalt and Boron, herein exemplified with $Co_{20}Fe_{60}B_{20}$. Above the fixed layer is seen a dielectric layer (DE) layer 166, such as comprising Magnesium-oxide (MgO). The DE layer separates the free layer 164, from a FM fixed layer 168 of another ferromagnetic material (e.g., iron), such as one also containing Cobalt and Boron, herein exemplified with $Co_{60}Fe_{20}B_{20}$. An antiferromagnetic inter-layer exchange coupling layer is optionally provided in a preferred embodiment, such as comprising Ruthenium (Ru) 170 (e.g., 0.85 nm) to provide antiferromagnetic inter-layer exchange coupling. Then an exchange-biased layer of a CoFe material, such as $Co_{70}Fe_{30}$, (e.g., 2.3 nm) 172 is optionally incorporated in a preferred embodiment, the magnetization orientation of which is pinned by exchange bias within an exchange bias pinning layer, such as comprising a layer of antiferromagnetic material, such as a platinum-manganese (PtMn) combination (e.g., 20 nm) 174. A top conductive electrode 176 is then seen on top of the stack and works in combination with bottom electrode 160 for applying voltages across said MEJ for reading and writing. By way of example and not limitation, the pillar of the devices utilized in this implementation of this embodiment are 170 nm (178)×60 nm (180) elliptical nanopillars.

2.1 VCMA-Induced Switching.

Switching is performed in the MEJ by exploiting the voltage-controlled magnetic anisotropy (VCMA) at the interface between the Fe-rich CoFeB free layer and MgO. In these MeRAM devices, the free layer thickness may be chosen such that the interfacial (voltage-controlled) perpendicular anisotropy is close to compensate the easy-plane shape anisotropy, a condition that enhances the tunability of the coercivity by voltage.

Figure 9:
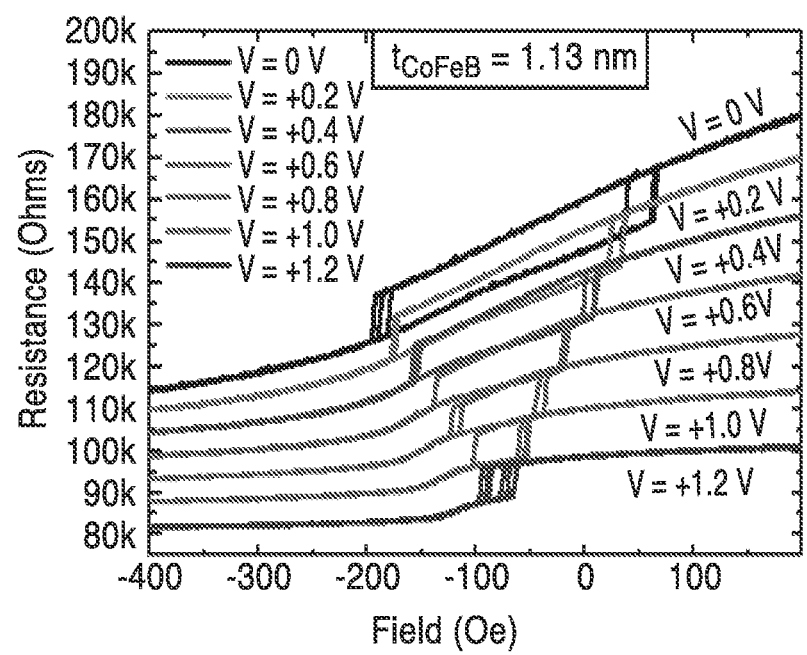
FIG. 9 is a graph of resistance with respect to the intensity of the magnetic field according to an element of the present invention.

FIG. 9 depicts coercivity and resistance changes in response to applied voltage. In the set of curves in the figure, coercivity is shown being reduced in response to the VCMA effect from about 120 Oe at equilibrium to approximately 10-20 Oe by applying about 1 V.

Figure 10A:
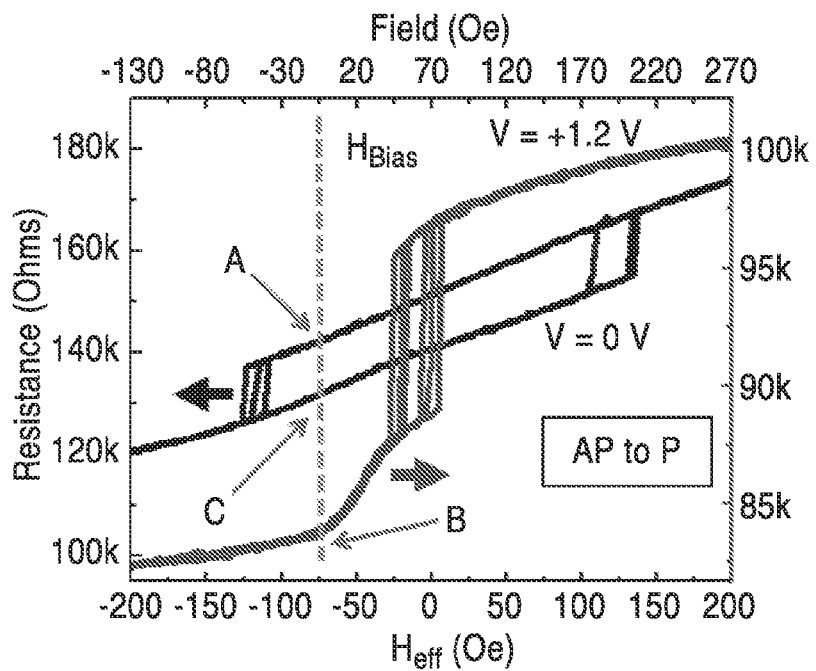
FIG. 10A and FIG. 10B are graphs of MEJ resistance in response to effective magnetic field according to an element of the present invention.
Figure 10B:
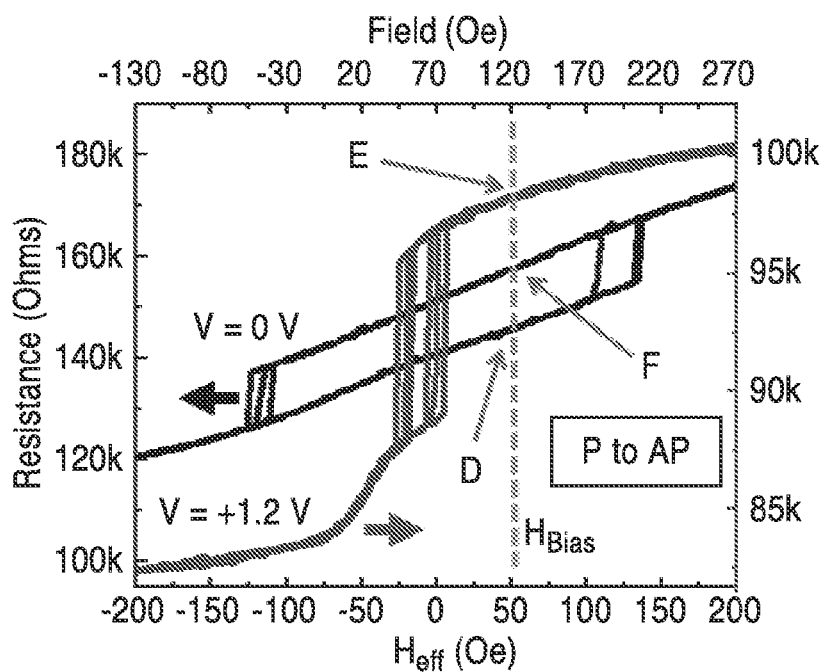

FIG. 10A and FIG. 10B illustrate VCMA switching from AP to P stated in FIG. 10A and from P to AP stated in FIG. 10B. These magnetic hysteresis curves at equilibrium (0 V) and at a positive voltage, illustrate the switching process. The equilibrium state has a coercivity of about 120 Oe, and the TMR ratio between its high- and low-resistance domain wall states is approximately 9%. The loops show an offset field $H_{off}$ of about 70 Oe due to non-zero coupling to the pinned layer. The top horizontal axis denotes the easy axis bias field $H_{bias}$ applied to the device, while the bottom horizontal axis shows the effective field $H_{eff}=H_{bias}-H_{off}$. When a positive voltage pulse is applied to a device in the high-resistance state as seen at point A in FIG. 10A and FIG. 11, the perpendicular anisotropy of the free layer is modified, reducing its coercivity. As a result, under the new energy landscape, the magnetization is forced to relax to the low-resistance intermediate state, as seen at point B in FIG. 10A and FIG. 11. After the voltage is removed, the magnetization reconfigures into the opposite state as seen at point C in FIG. 10A and FIG. 11, completing the reversal process. FIG. 10B shows that the sign of the effective field acting on the free layer, (i.e., $H_{eff}$) will determine the direction of switching, and hence the voltage-induced switching is unidirectional for a given bias magnetic field. The effect of this bias field may be replaced by a non-zero leakage current through the device, as described below.

2.2 Switching Dynamics.

Figure 11:
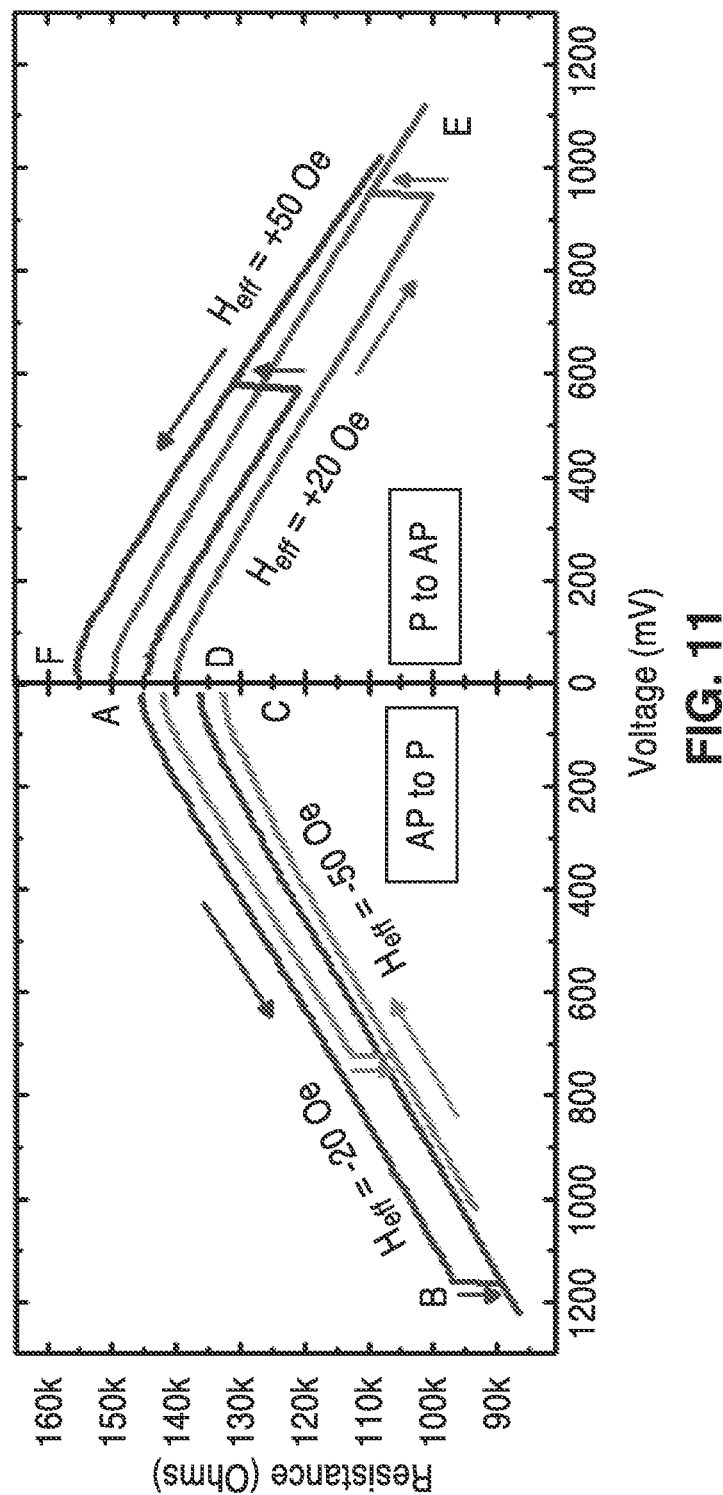
FIG. 11 is a graph of quasi-static resistance with respect to voltage for different effective magnetic fields for a voltage controlled MEJ according to an element of the present invention.

FIG. 11 depicts quasi-static loops indicating switching hysteresis and voltage dependence of the MEJ resistance. Switching in both directions was performed using voltages of the same polarity, with a small bias magnetic field to determine the direction. The large resistance of the embodied MEJ assures that the leakage currents were always <10 µA, and therefore the observed phenomena correspond to purely voltage effects.

Figure 12:
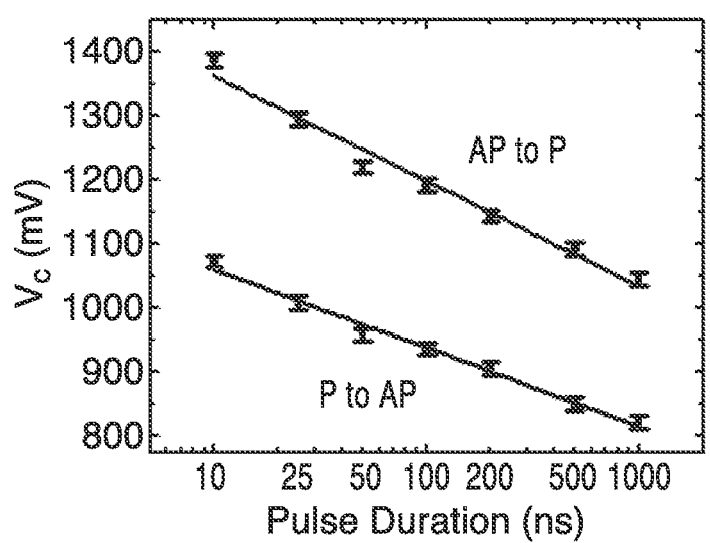
FIG. 12 is a graph of switching voltage and pulse duration for P to AP and AP to P switching for a voltage controlled MEJ according to an element of the present invention.

FIG. 12 depicts the dependence of the mean switching voltage $V_c$ as a function of the applied voltage pulse width t, measured down to 10 ns, fitting well into a thermal activation model given as follows.

$$V_C=V_{C0}(1-\Delta^{-1}\ln(t/\tau_0))$$

The results demonstrate voltage-induced switching of the free layer with amplitudes of approximately 1 V for both low (parallel, or P) to high (anti-parallel, or AP), and AP to P switching directions, translating into switching energies ~60 fJ (at 10 ns). This level of switching energy is one order of magnitude smaller than that compared to STT MRAM switching. It should also be appreciated that the leakage current can be further reduced below <$10^5$ A/cm2 by fabricating the MEJ with a thicker layer of MgO.

Figure 13:
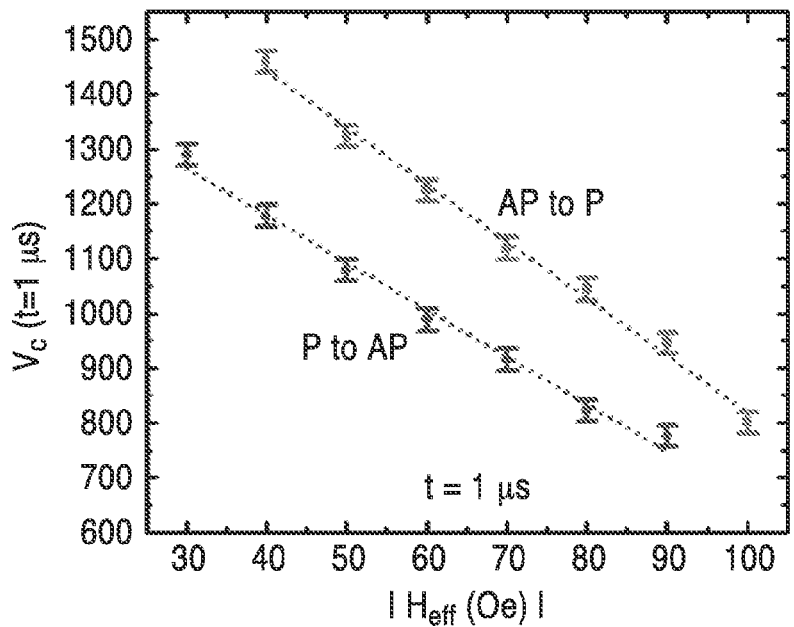
FIG. 13 is a graph of switching voltage and magnetic field intensity for P to AP and AP to P switching for a voltage controlled MEJ according to an element of the present invention.

FIG. 13 depicts the switching voltage decrease with increasing $H_{eff}$, indicating a trade-off between the switching voltage amplitude and the magnetic field which assists the switching process.

Figure 14:
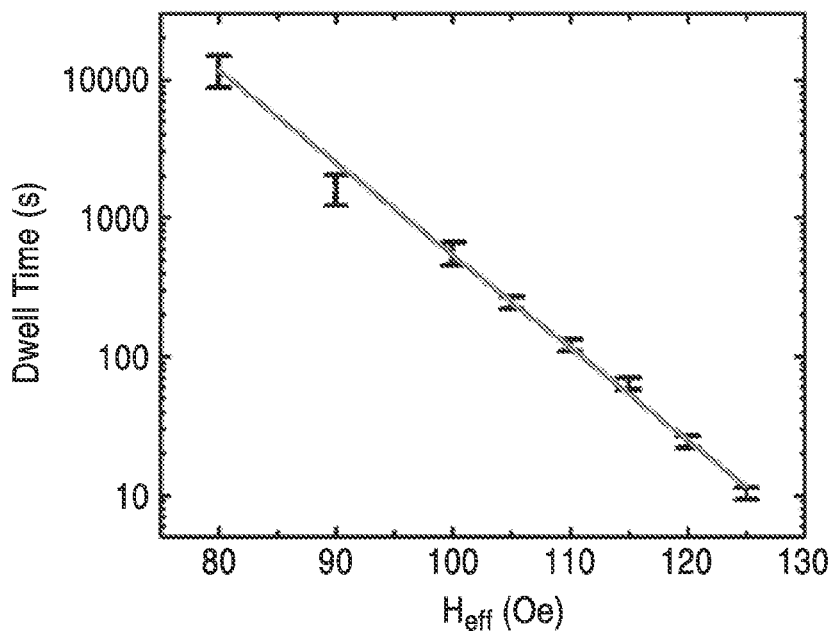
FIG. 14 is a graph of dwell time in response to magnetic field intensity for thermally activated switching of a voltage controlled MEJ according to an element of the present invention.

FIG. 14 depicts thermal stability of the MEJ in its equilibrium state by measuring the time required for thermally activated switching which increases as $H_{eff}$ is reduced. For this measurement the mean time was measured for thermally-induced switching for different magnetic fields applied to the device. Extrapolation of the curve to the standby ($H_{eff}=0$ Oe) condition yields a retention time of ~$1.7\times10^9$ seconds, which is beyond 50 years, and is sufficient stability for a nonvolatile memory operation.

2.3. Combined VCMA+STT Switching.

To overcome the need for different external magnetic fields to induce switching in opposite directions, a small non-zero leakage current may be utilized in selected embodiments. It will be appreciated that the small leakage current is still not sufficient to bring about STT-induced switching, but rather contributes to a field-like STT, acting as a voltage-dependent $H_{eff}$ on the free layer.

Varying pulse amplitude (or length) allows controlling switching direction without the need for varying external magnetic fields; which can be understood from measured switching probability of FIG. 2. From this figure it should be appreciated that VCMA and STT can be combined into a unipolar set/reset write scheme, where voltage pulses of the same polarity, but different amplitudes or lengths, are utilized to switch the device in opposite directions without changing $H_{eff}$ in the free layer. Voltage pulses of the opposite polarity will not switch the device, thus they are utilized according to preferred embodiments of the invention for creating disturbance-free reads for the nonvolatile memory elements.

From the discussion above it will be appreciated that the invention can be embodied in various ways, including the following:

1. A voltage-controlled magnetic anisotropy (VCMA) magneto-electric random access memory (MeRAM) apparatus, comprising: an array of magneto-electric random access memory (MeRAM) memory cells; a magneto-electric tunnel junction (MEJ) having at least two ferromagnetic (FM) layers separated by a dielectric (DE) layer within each said MeRAM memory cell, and in which said at least two FM layers comprise at least an FM fixed layer and an FM free layer; and a transistor gated by a word line and having its source and drain connections separately coupled to said MEJ and to a source line associated with a first and second bit line; wherein said MEJ is switched during data writing in response to voltage-controlled magnetic anisotropy (VCMA) by putting its free layer into a meta-stable intermediate state using an applied voltage pulse, whereby as voltage is removed, the free layer relaxes to either a first or second data state comprising a parallel (P) or anti-parallel (AP) state; wherein data can be written in a multiple word burst write to a plurality of said MEJs within said MeRAM memory cells in response to generating a common address for each of the words in the multiple word burst and by activating a data word for each word in said multiple word burst on sequential clock cycles, with the first and second bit lines generating first and second voltage profiles of a first polarity in writing data of a first and second state to said plurality of MEJs of MeRAM cells; wherein data is read from said MEJ of said MeRAM memory cell in response to using a second voltage polarity across said MEJ, whereby read voltages across each said MEJ do not disturb data written to each said MEJ; and wherein data can be read from two words in a back-to-back manner with a first data word read in a first clock cycle by activating a first word line and a first bit line with the other bit line floating, then a second data word read in a second clock cycle by activating a second word line and a second bit line with the other bit line floating.

2. The apparatus of any of the previous embodiments, wherein during a data read magnetization orientation of said MEJ is read by measuring electrical resistance through said MEJ including its two FM layers and said DE layer in response to tunneling magnetoresistance (TMR) properties.

3. The apparatus of any of the previous embodiments, wherein said ferromagnetic layers comprise a CoFeB material.

4. The apparatus of any of the previous embodiments, wherein said fixed layer comprises $Co_{60}Fe_{20}B_{20}$ material.

5. The apparatus of any of the previous embodiments, wherein said free layer comprises $Co_{20}Fe_{60}B_{20}$ material.

6. The apparatus of any of the previous embodiments, further comprising at least one Ru layer adjacent said fixed ferromagnetic layer to provide antiferromagnetic inter-layer exchange coupling.

7. The apparatus of any of the previous embodiments, further comprising at least one layer providing antiferromagnetic inter-layer exchange coupling.

8. The apparatus of any of the previous embodiments, wherein said layer providing antiferromagnetic inter-layer exchange coupling comprises a Ruthenium (Ru) layer.

9. The apparatus of any of the previous embodiments, further comprising at least one exchange biased layer whose magnetization is pinned by an exchange bias pinning layer.

10. The apparatus of any of the previous embodiments, wherein said exchange biased layer comprises a CoFe material, and said exchange bias pinning layer comprises platinum-manganese (PtMn).

11. The apparatus of any of the previous embodiments, wherein said dielectric material comprises MgO.

12. The apparatus of any of the previous embodiments, wherein said MeRAM apparatus is fabricated with a complementary metal oxide semiconductor (CMOS) process below 90 nanometers.

13. The apparatus of any of the previous embodiments, wherein said magneto-electric tunnel junction (MEJ) has a leakage current less than 10 microamps ($\mu A$).

14. The apparatus of any of the previous embodiments, wherein said magneto-electric tunnel junction (MEJ) within said MeRAM has a data retention time exceeding 50 years.

15. A voltage-controlled magnetic anisotropy (VCMA) magneto-electric random access memory (MeRAM) apparatus, comprising: an array of magneto-electric random access memory (MeRAM) memory cells; a magneto-electric tunnel junction (MEJ) having at least two ferromagnetic (FM) layers separated by a dielectric layer within each said MeRAM memory cell, and in which said at least two FM layers comprise at least an FM fixed layer and an FM free layer; and a transistor gated by a word line and having its source and drain connections separately coupled to said MEJ and to a source line associated with a first and second bit line; wherein said MEJ is switched during data writing in response to voltage-controlled magnetic anisotropy (VCMA) by putting its free layer into a meta-stable intermediate state using an applied voltage pulse, whereby as voltage is removed, the free layer relaxes to either a first or second data state comprising a parallel (P) or anti-parallel (AP) state; wherein data is written in a multiple word burst write to a plurality of said MEJs within said MeRAM memory cells in response to generating a common address for each of the words in the multiple word burst and by activating a data word for each word in said multiple word burst on sequential clock cycles, with the first and second bit lines generating first and second voltage profiles of a first polarity in writing data of a first and second state to said plurality of MEJs of MeRAM cells; and wherein data is read from said MEJ of said MeRAM memory cell in response to using a second voltage polarity across said MEJ, whereby read voltages across said MEJ do not disturb data written to said MEJ.

16. The apparatus of any of the previous embodiments, wherein data can be read from two words in a back-to-back manner with a first data word read in a first clock cycle by activating a first word line and a first bit line with the other bit line floating, then a second data word read in a second clock cycle by activating a second word line and a second bit line with the other bit line floating.

17. The apparatus of any of the previous embodiments, wherein during a data read magnetization orientation of said MEJ is read by measuring electrical resistance through said two FM layers and said DE layer in response to tunneling magnetoresistance (TMR) properties.

18. The apparatus of any of the previous embodiments, wherein said magneto-electric tunnel junction (MEJ) has a leakage current less than 10 microamps ($\mu A$).

19. A voltage-controlled magnetic anisotropy (VCMA) magneto-electric random access memory (MeRAM) apparatus, comprising: an array of magneto-electric random access memory (MeRAM) memory cells; a magneto-electric tunnel junction (MEJ) having at least two ferromagnetic (FM) layers separated by a dielectric (DE) layer within each said MeRAM memory cell, and in which said at least two FM layers comprise at least an FM fixed layer and an FM free layer; and a transistor gated by a word line and having its source and drain connections separately coupled to said MEJ and to a source line associated with a first and second bit line; wherein said MEJ is switched during data writing in response to voltage-controlled magnetic anisotropy (VCMA) by putting its free layer into a meta-stable intermediate state using an applied voltage pulse, whereby as voltage is removed, the free layer relaxes to either a first or second data state comprising a parallel (P) or anti-parallel (AP) state; wherein data is read from said MEJ of said MeRAM memory cell in response to using a second voltage polarity across said MEJ, whereby read voltages across said MEJ do not disturb data written to said MEJ; and wherein data can be read from two words in a back-to-back manner with a first data word read in a first clock cycle by activating a first word line and a first bit line with the other bit line floating, then a second data word read in a second clock cycle by activating a second word line and a second bit line with the other bit line floating.

20. The apparatus of any of the previous embodiments, wherein data can be written in a multiple word burst write to a plurality of said MEJs within said MeRAM memory cells in response to generating a common address for each of the words in the multiple word burst and by activating a data word for each word in said multiple word burst on sequential clock cycles, with the first and second bit lines generating first and second voltage profiles of a first polarity in writing data of a first and second state to said plurality of MEJs of MeRAM cells.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

Feature Summary and Comparison for 65 nm Technologies

| Parameter | eDRAM | SRAM | STT-RAM | This MeRAM |
|---|---|---|---|---|
| $V_{DD}$ | 1.0/1/7 | 1.2 | 1.2 | 1.0 |
| Operating Freq. | 500 MHz | 4.2 GHz | 66.6 MHz | 1.2 GHz |
| Cell Size [$\mu m^2$] | 0.1265 | 0.57 | 0.3584 | 0.1225 |
| Rd/Wr Energy | 1.041 pj/bit | 446 fj/bit | ~1 pj/bit | 161 fj/bit |
| Leak/Refresh Energy | 0.801 pj/bit | 10.9 aJ/bit | N/A | N/A |

What is claimed is:

1. A voltage-controlled magnetic anisotropy (VCMA) magneto-electric random access memory (MeRAM) apparatus, comprising:

an array of magneto-electric random access memory (MeRAM) memory cells;

a magneto-electric tunnel junction (MEJ) having at least two ferromagnetic (FM) layers separated by a dielectric (DE) layer within each said MeRAM memory cell, and in which said at least two FM layers comprise at least an FM fixed layer and an FM free layer; and a transistor gated by a word line and having its source and drain connections separately coupled to said MEJ and to a source line associated with a first and second bit line;

wherein said MEJ is switched during input data writing in response to voltage-controlled magnetic anisotropy (VCMA) by either: (i) putting its free layer into a meta-stable intermediate state using an applied voltage pulse, whereby as voltage is removed, the free layer relaxes to either a first or second data state comprising a parallel (P) or anti-parallel (AP) state, with said final data state determined by non-zero leakage current through the MeRAM apparatus, which although not sufficient to bring about spin transfer torque-induced switching by itself, contributes to a spin transfer torque, which acts as a voltage-dependent effective magnetic field on said FM free layer; or by (ii) putting free layer magnetization into a precessional motion when a voltage pulse is applied, so that final state is determined in response to pulse width utilized, and not by stray fields or spin transfer torque;

wherein input data is written in a multiple word burst write, in which two adjacent input data are written in a simultaneous manner, to a plurality of said MEJs within said MeRAM memory cells in response to generating a common address for each of the input data on sequential clock cycles, with the first and second bit lines generating first and second voltage profiles of a first polarity in writing input data of a first and second state to said plurality of MEJs of MeRAM cells;

wherein said MEJ is switched in response to voltages of a first polarity, and is read in response to voltages of an opposite polarity to minimize disturbance of stored data during the read process;

wherein stored data is read from said MEJ of said MeRAM memory cell in response to using a second voltage polarity across said MEJ, whereby read voltages across each said MEJ do not disturb stored data written to each said MEJ; and wherein stored data is read in a back-to-back manner, in which a first stored data is read in a sequential manner, with a first stored data read in a first clock cycle by activating a first word line and a first bit line with the other bit line floating, then a second stored data is read in a second clock cycle by activating a second word line and a second bit line with the other bit line floating.

2. The apparatus recited in claim 1, wherein during a stored data read magnetization orientation of said MEJ is read by measuring electrical resistance through said MEJ including its two FM layers and said DE layer in response to tunneling magnetoresistance (TMR) properties; and wherein voltage applied to measure said electrical resistance of said MEJ is opposite in polarity to the voltage used to write input data into said MEJ.

3. The apparatus recited in claim 1, wherein said ferromagnetic layers comprise a CoFeB material.

4. The apparatus recited in claim 1, wherein said fixed layer comprises $Co_{60}Fe_{20}B_{20}$ material.

5. The apparatus recited in claim 1, wherein said free layer comprises $Co_{20}Fe_{60}B_{20}$ material.

6. The apparatus recited in claim 1, further comprising at least one Ru layer adjacent said fixed ferromagnetic layer to provide antiferromagnetic inter-layer exchange coupling.

7. The apparatus recited in claim 1, further comprising at least one layer providing antiferromagnetic inter-layer exchange coupling.

8. The apparatus recited in claim 7, wherein said layer providing antiferromagnetic inter-layer exchange coupling comprises a Ruthenium (Ru) layer.

9. The apparatus recited in claim 1, further comprising at least one exchange biased layer whose magnetization is pinned by an exchange bias pinning layer.

10. The apparatus recited in claim 9, wherein said exchange biased layer comprises a CoFe material, and said exchange bias pinning layer comprises platinum-manganese (PtMn).

11. The apparatus recited in claim 1, wherein said dielectric material comprises MgO.

12. The apparatus recited in claim 1, wherein said MeRAM apparatus is fabricated with a complementary metal oxide semiconductor (CMOS) process below 90 nanometers.

13. The apparatus recited in claim 1, wherein said magneto-electric tunnel junction (MEJ) has a leakage current less than 10 microamps ($\mu A$).

14. The apparatus recited in claim 1, wherein said magneto-electric tunnel junction (MEJ) within said MeRAM has a data retention time exceeding 50 years.

15. A voltage-controlled magnetic anisotropy (VCMA) magneto-electric random access memory (MeRAM) apparatus, comprising:
   an array of magneto-electric random access memory (MeRAM) memory cells;
   a magneto-electric tunnel junction (MEJ) having at least two ferromagnetic (FM) layers separated by a dielectric layer within each said MeRAM memory cell, and in which said at least two FM layers comprise at least an FM fixed layer and an FM free layer; and
   a transistor gated by a word line and having its source and drain connections separately coupled to said MEJ and to a source line associated with a first and second bit line;
   wherein said MEJ is switched during input data writing in response to voltage-controlled magnetic anisotropy (VCMA) by either: (i) putting its free layer into a metastable intermediate state using an applied voltage pulse, whereby as voltage is removed, the free layer relaxes to either a first or second data state comprising a parallel (P) or anti-parallel (AP) state, with said final data state determined by non-zero leakage current through the MeRAM apparatus, which although not sufficient to bring about spin transfer torque-induced switching by itself, contributes to a spin transfer torque, which acts as a voltage-dependent effective magnetic field on said FM free layer; or by (ii) putting free layer magnetization into a precessional motion when a voltage pulse is applied, so that final state is determined in response to pulse width utilized, and not by stray fields or spin transfer torque;
   wherein input data is written in a multiple word burst write, in which two adjacent input data are written in a simultaneous manner, to a plurality of said MEJs within said MeRAM memory cells in response to generating a common address for each of the input data on sequential clock cycles, with the first and second bit lines generating first and second voltage profiles of a first polarity in writing input data of a first and second state to said plurality of MEJs of MeRAM cells; and
   wherein said MEJ is switched in response to voltages of a first polarity, and is read in response to voltages of an opposite polarity to minimize disturbance of stored data during the read process;
   wherein stored data is read from said MEJ of said MeRAM memory cell in response to using a second voltage polarity across said MEJ, whereby read voltages across said MEJ do not disturb stored data previously written to said MEJ.

16. The apparatus recited in claim 15, wherein stored data is read in a back-to-back manner, in which a first stored data is read in a sequential manner, with a first stored data read in a first clock cycle by activating a first word line and a first bit line with the other bit line floating, then a second stored data is read in a second clock cycle by activating a second word line and a second bit line with the other bit line floating.

17. The apparatus recited in claim 15, wherein during a stored data read, magnetization orientation of said MEJ is read by measuring electrical resistance through said two FM layers and said DE layer in response to tunneling magnetoresistance (TMR) properties.

18. The apparatus recited in claim 15, wherein said magneto-electric tunnel junction (MEJ) has a leakage current less than 10 microamps ($\mu A$).

19. A voltage-controlled magnetic anisotropy (VCMA) magneto-electric random access memory (MeRAM) apparatus, comprising:
   an array of magneto-electric random access memory (MeRAM) memory cells;
   a magneto-electric tunnel junction (MEJ) having at least two ferromagnetic (FM) layers separated by a dielectric (DE) layer within each said MeRAM memory cell, and in which said at least two FM layers comprise at least an FM fixed layer and an FM free layer; and
   a transistor gated by a word line and having its source and drain connections separately coupled to said MEJ and to a source line associated with a first and second bit line;
   wherein said MEJ is switched during input data writing in response to voltage-controlled magnetic anisotropy (VCMA) by either: (i) putting its free layer into a metastable intermediate state using an applied voltage pulse, whereby as voltage is removed, the free layer relaxes to either a first or second data state comprising a parallel (P) or anti-parallel (AP) state, with said final data state determined by non-zero leakage current through the MeRAM apparatus, which although not sufficient to bring about spin transfer torque-induced switching by itself, contributes to a spin transfer torque, which acts as a voltage-dependent effective magnetic field on said FM free layer; or by (ii) putting free layer magnetization into a precessional motion when a voltage pulse is applied, so that final state is determined in response to pulse width utilized, and not by stray fields or spin transfer torque;
   wherein said MEJ is switched in response to voltages of a first polarity, and is read in response to voltages of an opposite polarity to minimize disturbance of previously stored data during the read process;
   wherein stored data is read from said MEJ of said MeRAM memory cell in response to using a second voltage polarity across said MEJ, whereby read voltages across said MEJ do not disturb stored data previously written to said MEJ; and
   wherein stored data is read from two words in a back-to-back manner, in which a first stored data is read in a sequential manner, with a first stored data read in a first clock cycle by activating a first word line and a first bit line with the other bit line floating, then a second stored data is read in a second clock cycle by activating a second word line and a second bit line with the other bit line floating.

20. The apparatus recited in claim 19, wherein input data is written in a multiple word burst write, in which two adjacent input data are written in a simultaneous manner, to a plurality of said MEJs within said MeRAM memory cells in response to generating a common address for each of the input data on sequential clock cycles, with the first and second bit lines generating first and second voltage profiles of a first polarity in writing input data of a first and second state to said plurality of MEJs of MeRAM cells.

* * * * *